United States Patent
Wang et al.

(10) Patent No.: US 8,114,756 B1
(45) Date of Patent: Feb. 14, 2012

(54) METHOD AND MANUFACTURE FOR HIGH VOLTAGE GATE OXIDE FORMATION AFTER SHALLOW TRENCH ISOLATION FORMATION

(75) Inventors: Fei Wang, San Jose, CA (US); Chih-Yun Lin, Kaohsiung (TW)

(73) Assignee: Spansion LLC, Sunnyvale, CA (US)

(*) Notice: Subject to any disclaimer, the term of this patent is extended or adjusted under 35 U.S.C. 154(b) by 0 days.

(21) Appl. No.: 12/850,252

(22) Filed: Aug. 4, 2010

(51) Int. Cl.
H01L 21/30 (2006.01)

(52) U.S. Cl. ........ 438/423; 438/257; 438/258; 438/593; 438/E21.211

(58) Field of Classification Search .................. 438/424, 438/275–278
See application file for complete search history.

(56) References Cited

U.S. PATENT DOCUMENTS

2008/0227265 A1* 9/2008 Kim ............................... 438/423
2010/0283108 A1* 11/2010 Sawada et al. ................. 257/368

* cited by examiner

*Primary Examiner* — Dung A. Le

(74) *Attorney, Agent, or Firm* — Frommer Lawrence & Haug LLP; Matthew M. Gaffney

(57) ABSTRACT

A method and manufacture for fabrication of flash memory is provided. In fabricating the periphery region of the flash memory, the low voltage gate oxides and high voltage gate oxides are grown to the same height as each other prior to STI etching. After STI etching and gap fill, the nitride above the high voltage gate oxide regions are etched, and the oxide in high voltage gate oxide regions is grown to the appropriate thickness for a high voltage gate oxide.

10 Claims, 8 Drawing Sheets

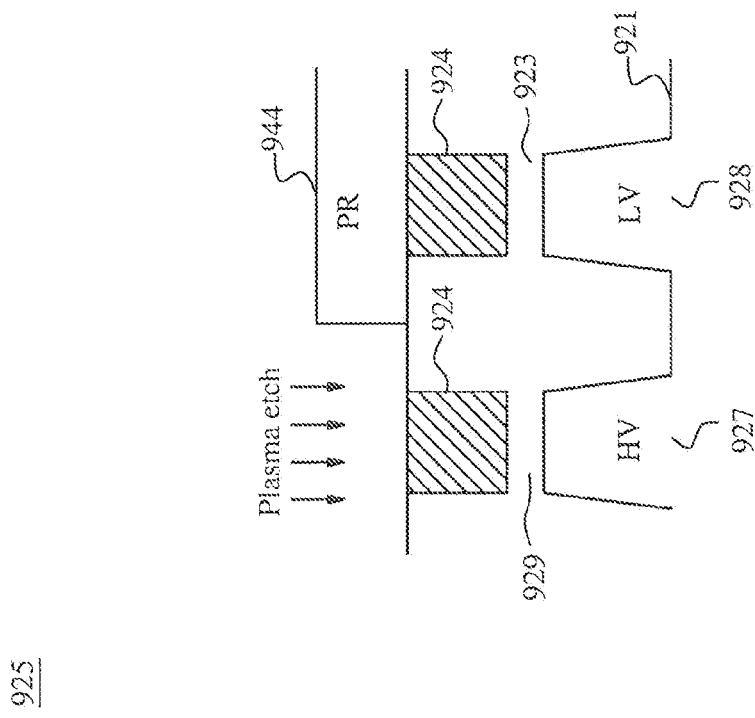
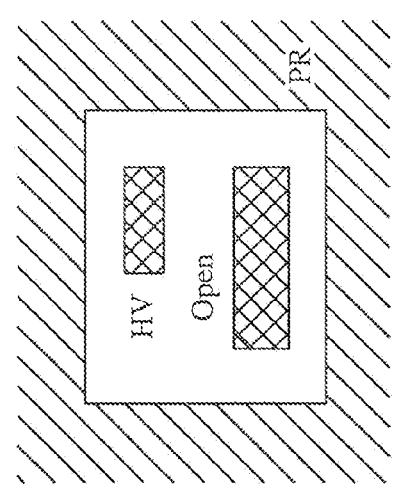
FIG. 9

US 8,114,756 B1

METHOD AND MANUFACTURE FOR HIGH VOLTAGE GATE OXIDE FORMATION AFTER SHALLOW TRENCH ISOLATION FORMATION

TECHNICAL FIELD

The invention is related to computer-readable memory, and in particular, but not exclusively, to a method and manufacture for high voltage gate oxide formation after shallow trench isolation (STI).

BACKGROUND

Various types of electronic memory have been developed in recent years. Some exemplary memory types are electrically erasable programmable read only memory (EEPROM) and electrically programmable read only memory (EPROM). EEPROM is easily erasable but lacks density in storage capacity, where as EPROM is inexpensive and denser but is not easily erased. "Flash" EEPROM, or Flash memory, combines the advantages of these two memory types. This type of memory is used in many electronic products, from large electronics like cars, industrial control systems, and etc. to small portable electronics such as laptop computers, portable music players, cell phones, and etc.

Flash memory is generally constructed of many memory cells where a single bit is held within each memory cell. Yet a more recent technology known as MirrorBit™ Flash memory doubles the density of conventional Flash memory by storing two physically distinct bits on opposite sides of a memory cell. The reading or writing of a bit occurs independently of the bit on the opposite side of the cell. A memory cell is constructed of bit lines formed in a semiconductor substrate. An oxide-nitride-oxide (ONO) dielectric layer formed over top of the substrate and bit lines. The nitride serves as the charge storage layer between two insulating layers. Word lines are then formed over top of the ONO layer perpendicular to the bit lines. Applying a voltage to the word line, acting as a control gate, along with an applied voltage to the bit line allows for the reading or writing of data from or to that location in the memory cell array. MirrorBit™ Flash memory may be applied to different types of flash memory, including NOR flash and NAND flash. Some flash memory cells uses shallow trench isolation (STI) to prevent electrical current leakage between adjacent memory cells in the flash memory.

BRIEF DESCRIPTION OF THE DRAWINGS

Non-limiting and non-exhaustive embodiments of the present invention are described with reference to the following drawings, in which:

FIG. 9 illustrates an embodiment of the portion of flash memory of FIG. 8, arranged in accordance with aspects of the invention.

DETAILED DESCRIPTION

Figure 1:
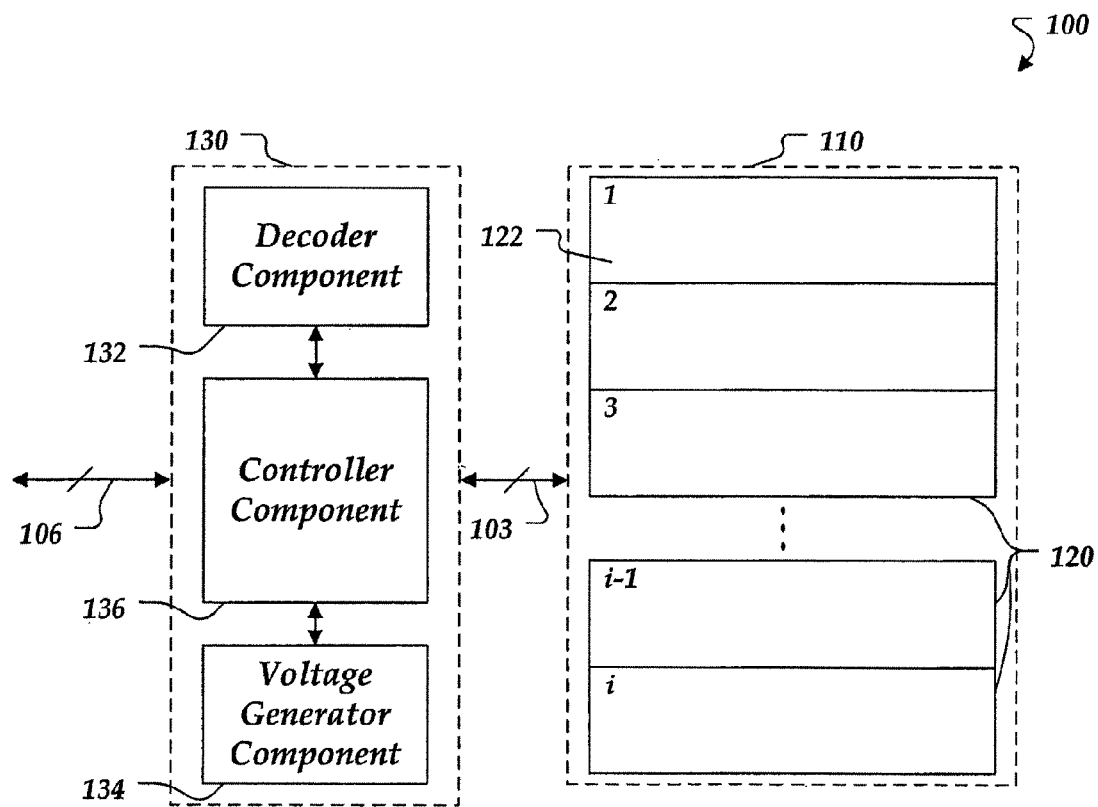
FIG. 1 illustrates a block diagram of an embodiment of a memory.

Various embodiments of the present invention will be described in detail with reference to the drawings, where like reference numerals represent like parts and assemblies throughout the several views. Reference to various embodiments does not limit the scope of the invention, which is limited only by the scope of the claims attached hereto. Additionally, any examples set forth in this specification are not intended to be limiting and merely set forth some of the many possible embodiments for the claimed invention.

Throughout the specification and claims, the following terms take at least the meanings explicitly associated herein, unless the context dictates otherwise. The meanings identified below do not necessarily limit the terms, but merely provide illustrative examples for the terms. The meaning of "a," "an," and "the" includes plural reference, and the meaning of "in" includes "in" and "on." The phrase "in one embodiment," as used herein does not necessarily refer to the same embodiment, although it may. Similarly, the phrase "in some embodiments," as used herein, when used multiple times, does not necessarily refer to the same embodiments, although it may. As used herein, the term "or" is an inclusive "or" operator, and is equivalent to the term "and/or," unless the context clearly dictates otherwise. The term "based, in part, on", "based, at least in part, on", or "based on" is not exclusive and allows for being based on additional factors not described, unless the context clearly dictates otherwise. The term "coupled" means at least either a direct electrical connection between the items connected, or an indirect connection through one or more passive or active intermediary devices. The term "signal" means at least one current, voltage, charge, temperature, data, or other signal.

Briefly stated, the invention is related to a method and manufacture for fabrication of flash memory. In fabricating the periphery region of the flash memory, the low voltage gate oxides and high voltage gate oxides are grown to the same height as each other prior to STI etching. After STI etching and gap fill, the nitride above the high voltage gate oxide regions are etched, and the oxide in high voltage gate oxide regions is grown to the appropriate thickness for a high voltage gate oxide.

FIG. 1 shows a memory environment in which embodiments of the invention may be employed. Not all the components illustrated in the figures may be required to practice the invention, and variations in the arrangement and type of the components may be made without departing from the spirit or scope of the invention. For example, although described in the context of a flash-based memory, the fabrication described herein may be employed in manufacturing other types of microelectronic memories or devices other than memory in which a SONOS-like trap layer is employed.

As shown, memory 100 includes arrayed memory 110 and memory controller 130. Memory controller 130 is arranged to communicate addressing data and program data over signal path 106. For example, signal path 106 can provide 8, 16, or more I/O lines of data. Memory controller 130 is also configured to access arrayed memory 110 over signal path 103. For example, memory controller 130 can read, write, erase, and perform other operations at portions of arrayed memory 110 via signal path 103. In addition, although shown as single lines, signal path 103 and/or signal path 106 may be distributed across a plurality of signal lines and/or bus lines.

Arrayed memory 110 includes memory sectors 120 (identified individually as sectors 1-i) that can be accessed via memory controller 130. Memory sectors 120 can include, for example, 256, 512, 1024, 2048 or more sectors having memory cells that can be individually or collectively accessed. For example, in a NAND-based architecture, the individual memory cells are accessed collectively. In other examples, the number and/or arrangement of memory sectors can be different. In one embodiment, for example, sectors 120 can be referred to more generally as memory blocks and/or can be configured to have a configuration that is different than a bit line, word line, and/or sector topology.

Memory controller 130 includes decoder component 132, voltage generator component 134, and controller component 136. In one embodiment, memory controller 130 may be located on the same chip as arrayed memory 110. In another embodiment, memory controller 130 may be located on a different chip, or portions of memory controller 130 may be located on another chip or off chip. For example, decoder component 132, controller component 134, and voltage generator component 136 can be located on different chips but co-located on the same circuit board. In other examples, other implementations of memory controller 130 are possible. For example, memory controller 130 can include a programmable microcontroller.

Decoder component 132 is arranged to receive memory addresses via addressing signal path 106 and to select individual sectors, arrays, or cells according to the architecture of arrayed memory 110. In an NAND-based architecture, individual memory cells can be accessed collectively but not individually.

Decoder component 132 includes, for example, multiplexer circuits, amplifier circuits, combinational logic, or the like for selecting sectors, arrays, and/or cells based on any of a variety of addressing schemes. For example, a portion of a memory address (or a grouping of bits) can identify a sector within arrayed memory 110 and another portion (or another grouping of bits) can identify a core cell array within a particular sector.

Voltage generator component 134 is arranged to receive one or more supply voltages (not shown) and to provide a variety of reference voltages required for reading, writing, erasing, pre-programming, soft programming, and/or under-erase verifying operations. For example, voltage generator component 134 can include one or more cascode circuits, amplifier circuits, regulator circuits, and/or switch circuits that can be controlled by controller component 136.

Controller component 136 is arranged to coordinate reading, writing, erasing, and other operations of memory 100. In one embodiment, controller component 136 is arranged to receive and transmit data from an upstream system controller (not shown). Such a system controller can include, for example, a processor and a static random access memory (SRAM) that can be loaded with executable processor instructions for communicating over signal path 106. In another embodiment, controller component 136 as well as other portions of memory controller 130 may be embedded or otherwise incorporated into a system controller or a portion of a system controller.

Embodiments of controller component 136 can include a state machine and/or comparator circuits. State machine and comparator circuits can include any of a variety of circuits for invoking any of a myriad of algorithms for performing reading, writing, erasing, or other operations of memory 100. State machines and comparator circuits can also include, for example, comparators, amplifier circuits, sense amplifiers, combinational logic, or the like.

In one embodiment, memory 100 is a flash-based memory including flash-based memory cells, such as flash-based NAND cells, NOR cells, or hybrids of the two.

Figure 2:
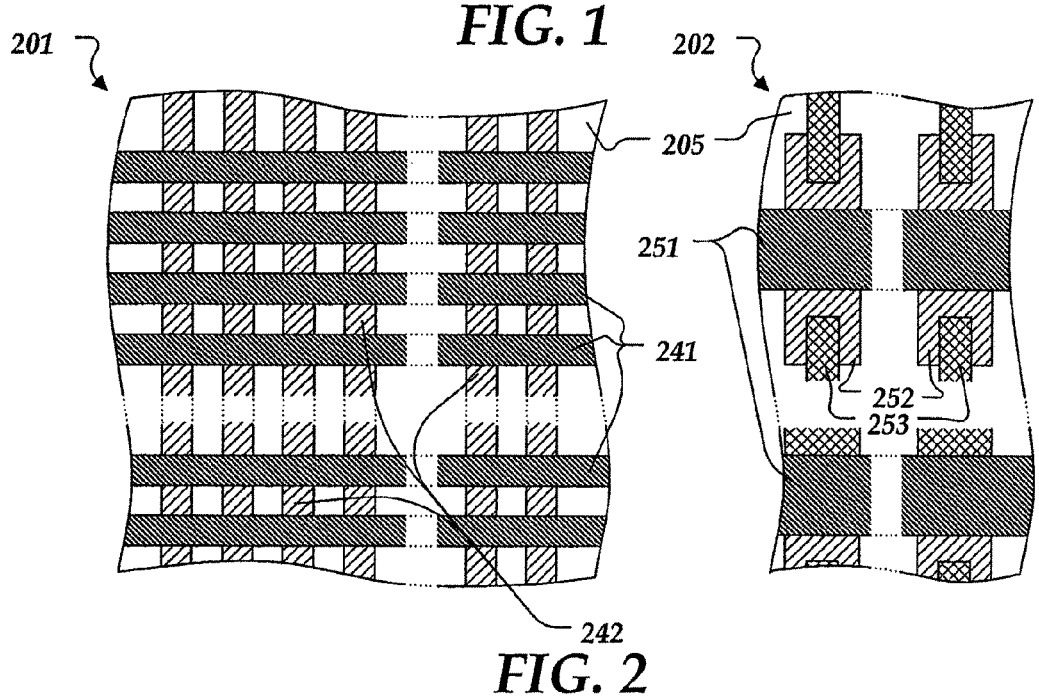
FIG. 2 shows a partial top plan view of an embodiment of core and peripheral sections of a memory that may be employed in the memory of FIG. 1.

FIG. 2 shows a partial top plan view of separate sections of a memory. Core section 201, for example, may be an embodiment of a portion of sector 120 of FIG. 1 and may include arrayed core memory cells. Peripheral section 202, for example, may be an embodiment of memory controller 110 of FIG. 1 or a portion of memory controller 110 of FIG. 1.

Core section 201 includes core polysilicon lines 241, conductive regions 242, and a portion of substrate 205. Portions of core polysilicon lines 241 are coupled to the gates of individual memory cells (not shown in FIG. 2) and can be configured as a word line, a source select gate line, and/or a drain select gate line. Portions of conductive regions 242 can include, for example, p-type and/or n-type doped regions of substrate 205 for forming source/drain regions and/or conductive lines. For example, conductive regions 242 can form portions of bit lines and/or other signal lines. Also, in some embodiments, individual conductive regions 242 extend at least partially underneath individual core polysilicon lines 241.

In one embodiment, core section 201 is arranged in a NOR topology, and individual memory cells can be individually accessed via individual conductive regions 242. In another embodiment, core section 201 is arranged in a NAND topology, and individual memory cells can be accessed though individual conductive regions 242 collectively but not individually. In other embodiments, hybrid architectures can be employed. For example, core section 201 can be configured to have a portion that is NAND-based and another portion that is NOR-based. Also, although not shown if FIG. 2, core section 201 may include any of a variety of interconnect and/or passivation layers, such as dielectric, conductive, or other layers. For example, conductive regions 242 can be positioned beneath a dielectric spacer layer.

Peripheral section 202 includes peripheral polysilicon lines 251, conductive regions 252, and interconnects 253. Portions of peripheral polysilicon lines 251 are coupled to individual peripheral devices (not shown in FIG. 2).

Portions of conductive regions 252 can include, for example, p-type and/or n-type doped regions of substrate 205 for forming conductive features, such as a source, a drain, or other type of well. Interconnects 253 can include conductive lines that electrically intercouple portions of peripheral section 202 and/or electrically couple core section 201 with peripheral section 202. For example, interconnects 253 can include a combination of metal lines and vias. Also, although not shown FIG. 2, peripheral section 202 may also include any of a variety of other interconnect and/or passivation layers.

Figure 3:
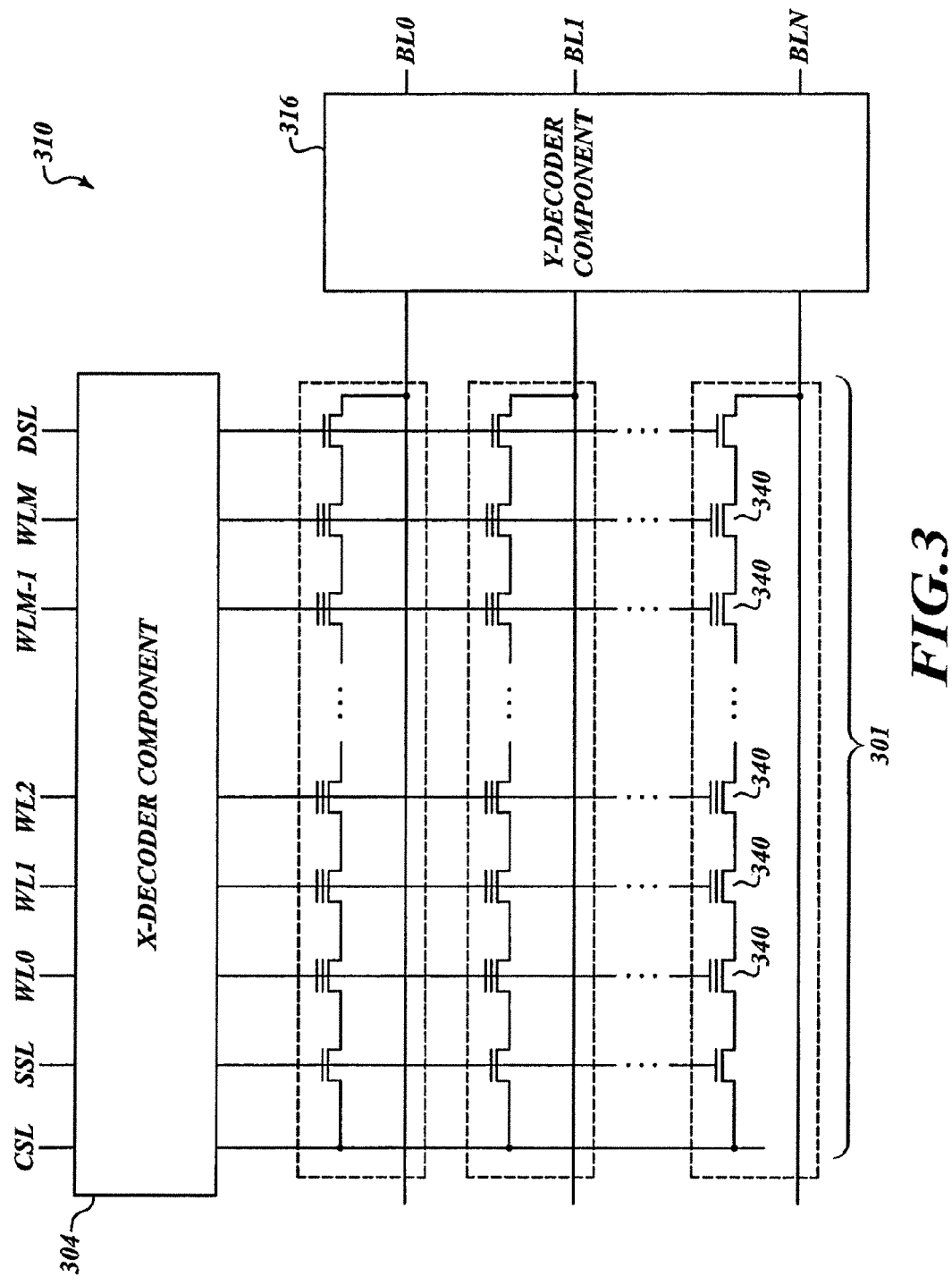
FIG. 3 illustrates a block diagram of an embodiment of a NAND memory array.

FIG. 3 illustrates a block diagram of an embodiment of a NAND memory array (310) that may be employed as an embodiment of memory array 110 of FIG. 1. Memory array 310 includes memory cells 340. Each memory cell 340 stores one or more bits of data. Memory array 310 can be associated with an X-decoder component 304 (e.g., word line (WL) decoder) and a Y-decoder component 316 (e.g., bit line (BL) decoder) that can each respectively decode inputs/outputs during various operations (e.g., programming, reading, verifying, erasing) that can be performed on the memory cells 340. The X-decoder component 304 and Y-decoder component 316 can each receive address bus information from memory controller 130 of FIG. 1, and can utilize such information to facilitate accessing or selecting the desired memory cell(s) (e.g., memory location(s)) associated with the command. The memory cells 340 can be formed in M rows and N columns. A common WL can be attached to the gate of each memory cell 340 in a row, such as word-lines WL0, WL1, WL2, through WLM. A common BL is attached collectively to cells 340, such as bit-lines BL0, BL1, through BLN as depicted in the respective diagrams. Respective voltages can be applied to one or more cells 340 through the WLs and BLs to facilitate performing operations, such as program, read, erase, and the like.

In some embodiments, the X-decoder component 304 is a WL encoder that receives a word line voltage that may be a relatively high boosted voltage. In this case, the X-decoder component 304 may contains transistors with high-voltage gate oxides. Other transistors in NAND memory array 310 that do not need such high voltages have low voltage gate oxides. The high voltage gate oxides need to be significantly thicker than the low voltage gate oxides due to the higher voltages that may be applied to the gate.

Modern semiconductor devices are typically created as integrated circuits manufactured on the surface of a substrate of semiconductor material. The processing begins by growing a wafer, which is typically done using the Czochralski process. Various devices are formed on the wafer using a series of steps that include deposition, removal processes (such as etching), patterning, and doping. Few steps or many hundreds of such steps may be used in various designs. The patterning steps may be performed by photolithography or other lithographic methods. For example, the wafer may be coated with a photoresist, which is exposed with a device that exposes light through photomasking, exposing portions of the wafer not blocked by the photomask to light. The exposed regions are removed so that the photoresist remains only in areas that were not exposed to light. This allows a layer to be etched according to the pattern on the photomask. After the devices have been formed on the wafer, various back-end processing and packaging is performed, including properly interconnecting the devices and bringing metal lines to the chip edge for attachment to wires.

A designer creates the device design in accordance with a set of design rules provided by the fabricator, and creates a series of design files based on the design. Various design tools may be used by the designer in creating the design, simulating the design, and checking the design for layout rules violations. When completed, the design files are provided to the fabricator, which are used to generate photomasks for use in the fabricating the device. The design files may be communicated in different ways, including over a network.

Figure 4:
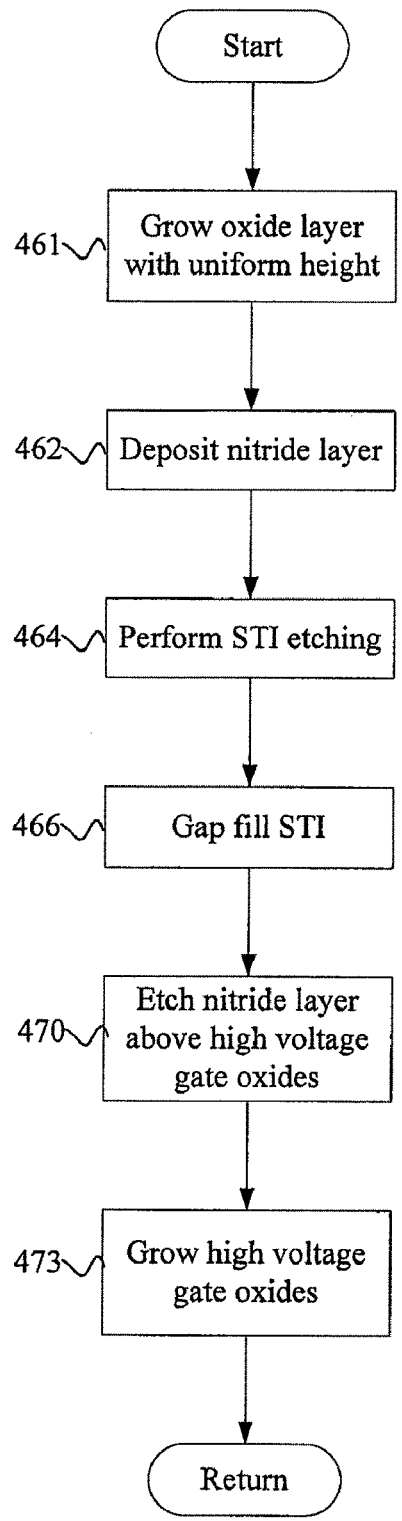
FIG. 4 shows a flow chart of an embodiment of a process.

FIG. 4 shows a flow chart of an embodiment of a process (460) for flash memory fabrication. After a start block, the process proceeds to step 461, where an oxide layer is grown on top of a semiconductor such that the oxide layer has a substantially uniform height. At this point in the process, high voltage gate oxides and the low voltage gate oxides are the same height, even though the high voltage gate oxides will eventually to be thicker.

The process then moves to block 462, where a nitride layer is deposited on top of the oxide layer. The process than advances to block 464, where STI etching is performed. During the STI etching, a number of shallow trenches are formed by anisotropically etching, in each region where the shallow trench is to be formed, through the nitride, oxide, and a portion of the semiconductor in that region. The shallow trenches separate several gate oxide regions from each other, including high voltage gate oxide regions and low voltage gate oxide regions. At this point, the high voltage gate oxide and the low voltage gate oxide are the same height.

The process then proceeds to block 466, where the STI is gap filled. This is accomplished by depositing an oxide layer over each of the shallow trenches such that the height of the oxide above each of the shallow trenches is substantially the same as the height of the nitride layer. In some embodiments, an oxide with a very high conforming capability is employed to fill the relatively gaps of the shallow trenches completely.

The process then moves to block 470, where the portion of the nitride layer above the high voltage gate oxides is etched anisotropically. The process then moves to block 473, where more oxide is grown above each of the high voltage gate oxide region to increase the height of the oxide layer at each of the high voltage gate oxide regions. In some embodiments, growing the oxide on each of the high voltage gate regions is accomplished that the height of the oxide layer in the high voltage gate oxide region is at least eight times the height of the oxide layer in the low voltage gate oxide region, such as approximately ten times the height in some embodiments. The process then advances to a return block, where other processing is resumed.

Figure 5:
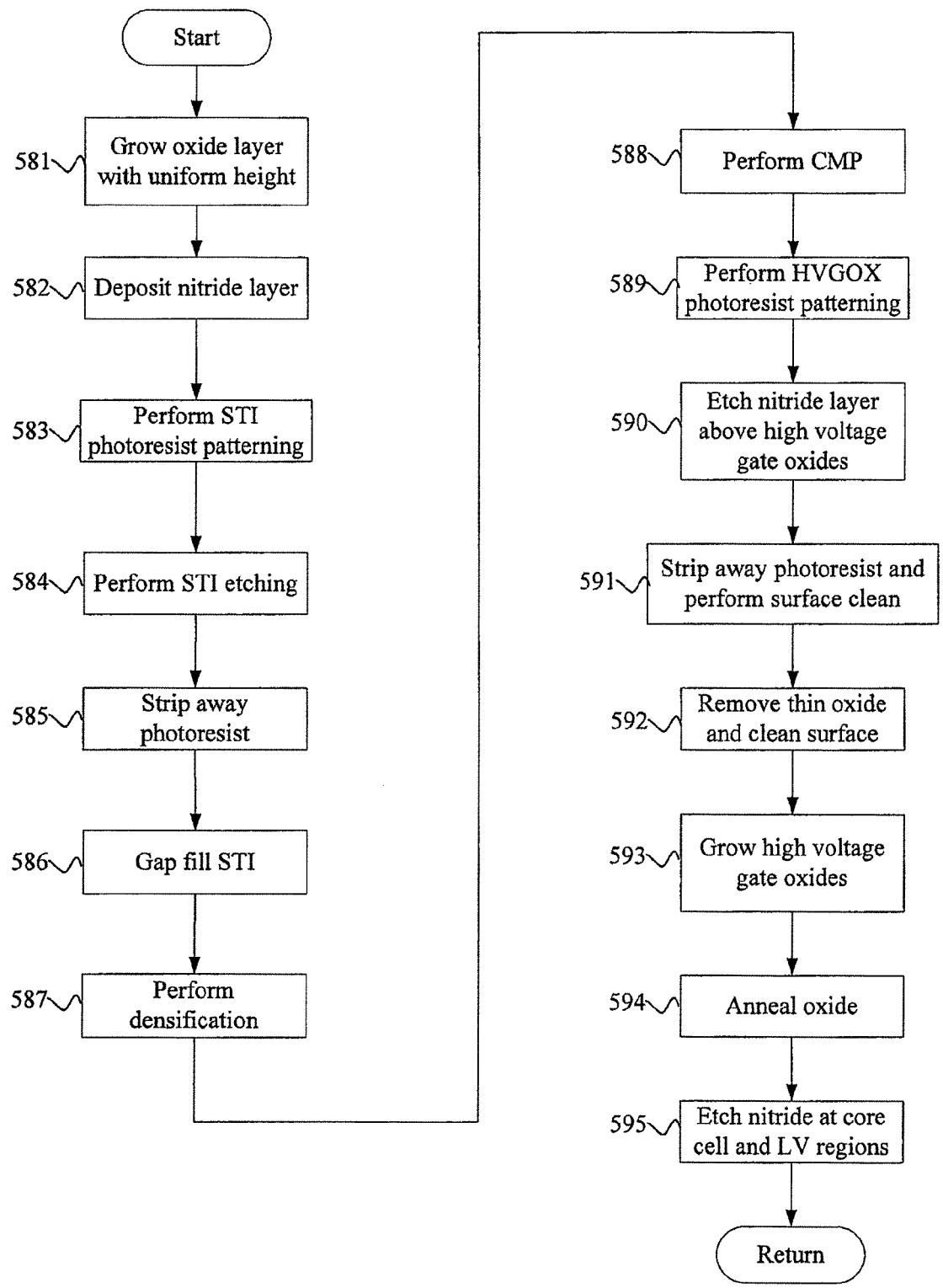
FIG. 5 illustrates a flow chart of an embodiment of the process of FIG. 4.

FIG. 5 illustrates a flow chart of an embodiment of process 580, which may be employed as an embodiment of process 460 of FIG. 4. After a start block, the process proceeds to block 581, where an oxide layer is grown on top of a semiconductor such that the oxide layer has a substantially uniform height. For example, the semiconductor may be silicon, with silicon dioxide as the oxide layer grown on top of the silicon. In some embodiment, the oxide is grown to a height of about 30 to 50 Angstroms. The process then advances to block 582, where a nitride layer is deposited on top of the oxide layer. For example, the nitride may be silicon nitride, or the like.

Figure 6:
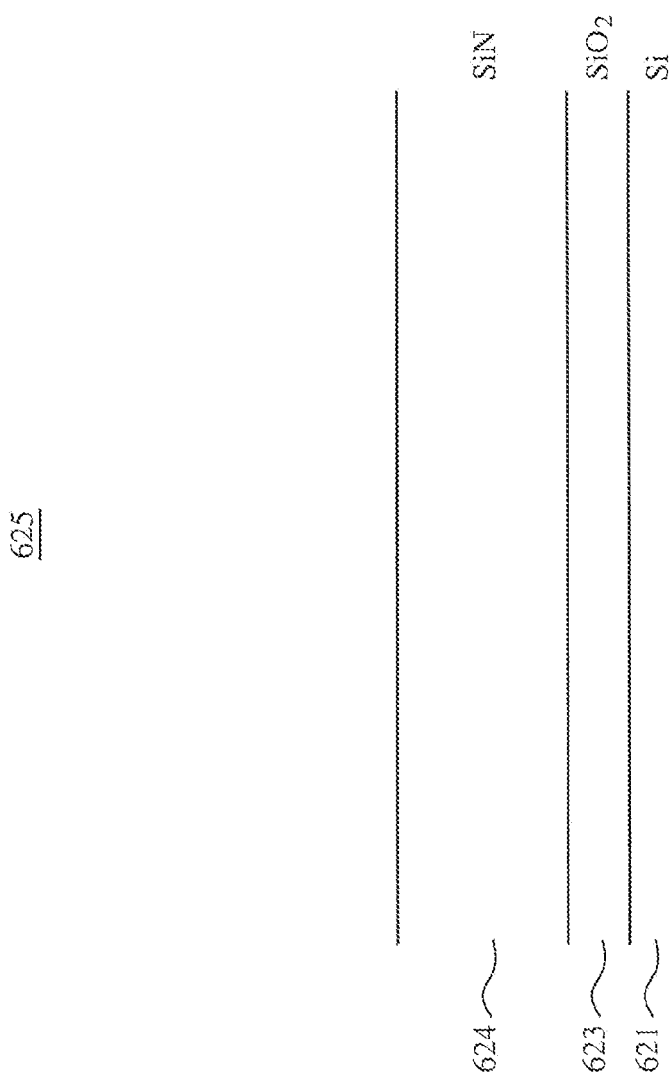
FIG. 6 shows an embodiment of a portion of a flash memory being fabricated.

FIG. 6 shows an embodiment of a portion 625 of a flash memory being fabricated, for example, after step 582. As shown, portion 625 includes silicon layer 621, silicon dioxide layer 623, and silicon nitride layer 624. This portion is the same in both the core cell region of the flash memory and the periphery of the flash memory.

The process then moves to block 583, where STI photoresist patterning is performed. The process then proceeds to block 584, where STI etching is performed. During the STI etching, a number of shallow trenches are fowled by anisotropically etching, in each region where the shallow trench is to be formed, through the nitride, oxide, and a portion of the semiconductor in that region. STI etching may be performed in different various ways known in the art. Chemistry such as $CH_4$, $CHF_3$, or $C_2F_6$ may be used to etch the nitride and the oxide, while a chemistry such as $CH_4$ or $C_2F_6$ may be used to etch the silicon. The process then moves to block 585, where the photoresist is stripped away.

Figure 7:
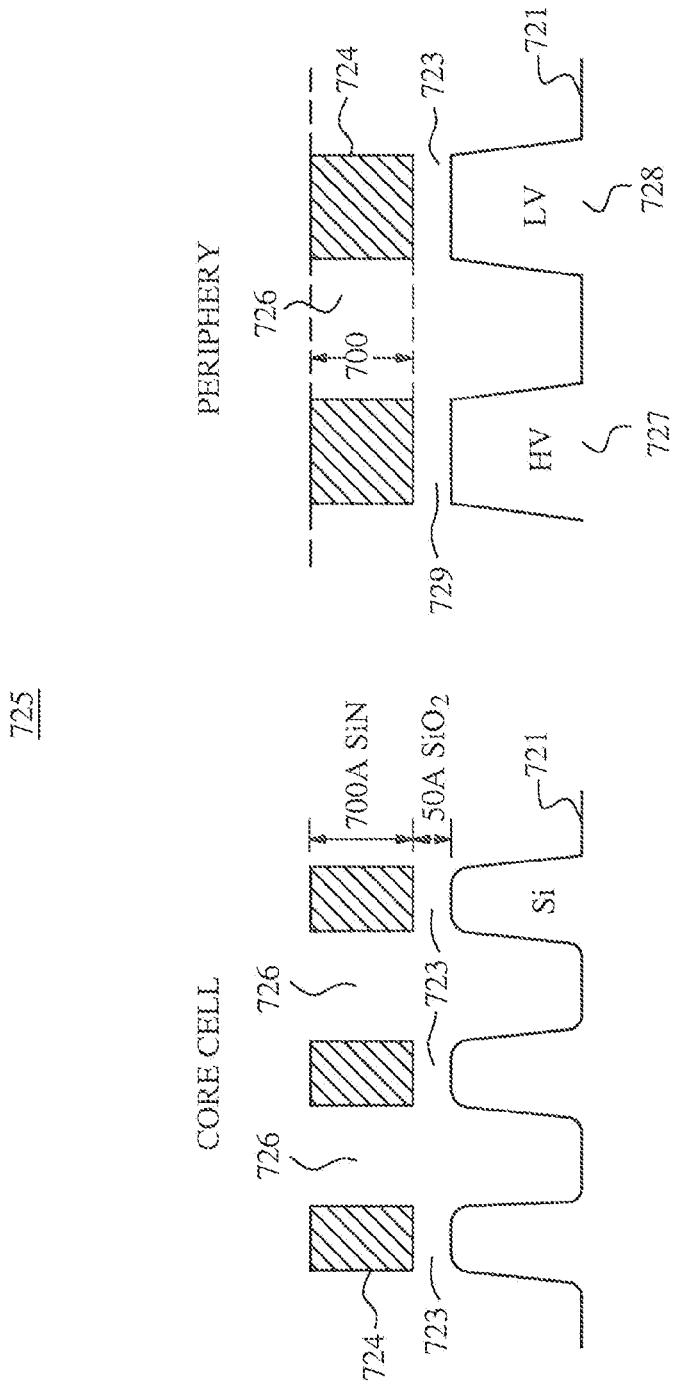
FIG. 7 illustrates an embodiment of the portion of flash memory of FIG. 6.

FIG. 7 illustrates an embodiment of portion 725 that may be employed as an embodiment of portion 625, for example, after step 585 is performed. As shown, shallow trenches 726 separate the various cells from each other. The periphery includes a high voltage gate oxide region 727 which includes a high voltage gate oxide (729), and a low voltage gate oxide region 728 which includes a low voltage gate oxide (723). The low voltage gate oxides (723) and the high voltage gate oxides (729) are each the same height, about 50 Angstroms in the embodiment illustrated. The silicon nitride regions 724 are each about 700 Angstroms in height in the embodiment illustrated.

The process then advances to block 586, where the STI is gap filled. This is accomplished by depositing an oxide layer over each of the shallow trenches such that the height of the oxide above each of the shallow trenches is substantially the same as the height of the nitride layer. In some embodiments, an oxide with a very high conforming capability is employed to fill the relatively gaps of the shallow trenches completely. For example, in some embodiments, a chemical vapor deposition (CVD) oxide film such as enhanced High Aspect Ratio Process (eHARP) may be used to deposit the oxide to gap fill the shallow trenches. The process then advances to block 587, where densification of the oxide used to gap fill the shallow trenches is performed. The densification of the oxide is typically accomplished solely with temperature, but can also be accomplished with temperature and chemistry. The densification process may sometimes use water and moisture, and sometimes use oxygen. The process then proceeds to block 588, where chemical mechanical polishing (CMP) is performed.

Figure 8:
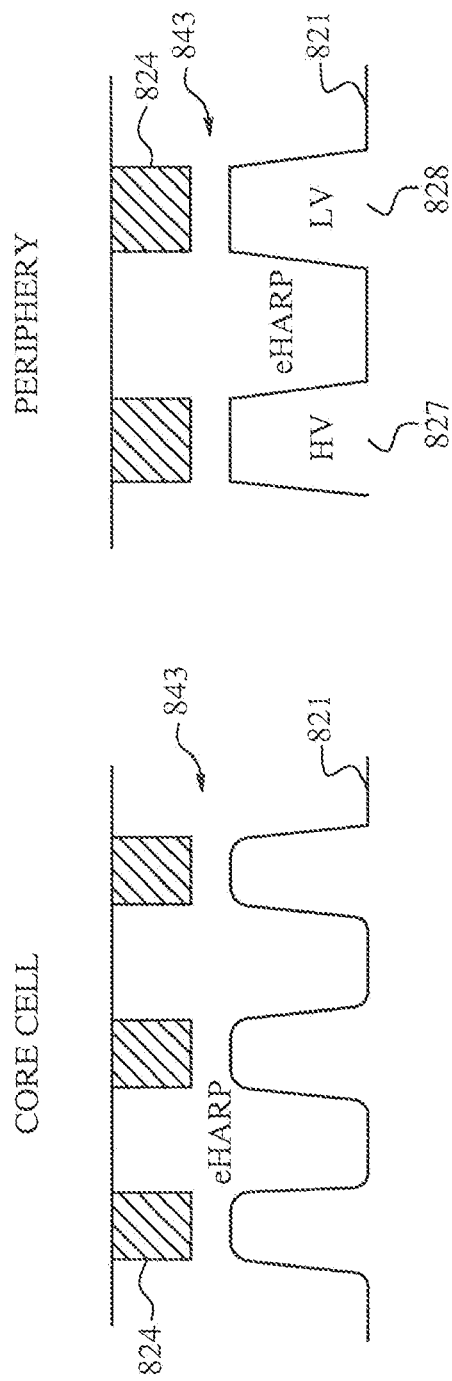
FIG. 8 shows an embodiment of the portion of flash memory of FIG. 7.

FIG. 8 shows an embodiment of portion 825 that may be employed as an embodiment of portion 725, for example, after step 588 is performed. As shown, an oxide such as eHARP fills the shallow trench. The oxide layer and the nitride layer together form a layer at the top that is substantially uniform in height.

The process then advances to block 589, where high voltage gate oxide (HVGOX) photoresist pattern is performed. The process then moves to block 590, where the portion of the nitride layer above the high voltage gate oxides is etched anisotropically. In some embodiments, the etching is performed with dry plasma etching. For example, in some embodiments, a tool such as the Shibaura tool may be used for high isotropic and high selectivity dry plasma etch to etch away the nitride above the high voltage gate oxide. In some embodiments, $CF_4$ and $O_2$ chemistry is employed.

FIG. 9 illustrates an embodiment of portion 925 that may be employed as an embodiment of portion the periphery of portion 825 of FIG. 8, for example, while step 590 is being performed. A photoresist 944 covers all of portion 925 except above the high voltage gate oxide region 927. This allows plasma etching to be performed on the nitride region 924 above each high voltage gate oxide 929.

The process then advances to block 591, where the photoresist is stripped away and a surface clean is performed. The process then proceeds to block 592, where the thin oxide is removed and the surface is cleaned. In some embodiments, this is accomplished with Dilute Hydrofluoric Acid (DHF) clean. DHF clean is a wet etch in which some of the thin oxide can be removed. The process then moves to block 593, where more oxide is grown above each of the high voltage gate oxide region to increase the height of the oxide layer at each of the high voltage gate oxide regions. For example, the high voltage oxide may be grown to a height of about 400 to 600 Angstroms. The process then advances to block 594, where the oxide is annealed. The process then proceeds to block 595, where the remaining original nitride at the core cells and low voltage gate oxide regions is etched away. In some embodiments, post trench etching of the nitride at block 595 is accomplished as a wet etch with phosphoric acid. The process then moves to a return block, where other processing is resumed.

The above specification, examples and data provide a description of the manufacture and use of the composition of the invention. Since many embodiments of the invention can be made without departing from the spirit and scope of the invention, the invention also resides in the claims hereinafter appended.

What is claimed is:

1. A method for memory device fabrication, comprising:
    fabricating a periphery region of a flash memory, wherein the fabricating includes:
        growing an oxide layer on top of a semiconductor layer, such that the oxide layer has a substantially uniform height;
        depositing a nitride layer on top of the oxide layer;
        anisotropically etching a plurality of shallow trenches, such that each shallow trench etching occurs through the oxide layer, the nitride layer, and a portion of the semiconductor layer, such that the shallow trenches separate a plurality of gate oxide regions, wherein the plurality of gate oxide regions include a plurality of high voltage gate oxide regions and a plurality of low voltage gate oxide regions;
        depositing an oxide layer over each of the shallow trenches such that the height of the oxide above each of the shallow trenches is substantially the same as the height of the nitride layer;
        anisotropically etching the nitride above each of the high voltage gate oxide regions; and
        after anisotropically etching the nitride above each of the high voltage gate oxide regions, growing an oxide on each of the high voltage gate oxide regions to increase the height of the oxide layer at each of the high voltage gate oxide regions.

2. The method of claim 1, further comprising:
    etching the nitride above each of the low voltage gate oxide regions.

3. The method of claim 1, wherein anisotropically etching the nitride above each of the high voltage gate oxide regions is accomplished with dry plasma etching.

4. The method of claim 1, wherein depositing an oxide layer over each of the shallow trenches is accomplished by chemical vapor deposition.

5. The method of claim 1, wherein growing the oxide on each of the high voltage gate regions is accomplished that the height of the oxide layer in the high voltage gate oxide region is at least eight times the height of the oxide layer in the low voltage gate oxide region.

6. The method of claim 1, wherein each of the high voltage gate oxide regions is included within an X-decoder region of the periphery of the flash memory.

7. The method of claim 1, further comprising:
    after depositing the oxide layer over each of the shallow trenches, performing densification of the oxide layer over each of the shallow trenches.

8. The method of claim 7, further comprising:
    after performing densification of the oxide layer over each of the shallow trenches, performing chemical mechanical polishing such that the oxide layer over each of the trenches and the nitride over each of the oxides gates forms a layer of substantially uniform height.

9. A machine-readable storage medium including an electronic design file that is arranged to control the performance of the method of claim 1.

10. A method, comprising transmitting, over a network, an article of manufacture including a machine-readable medium that includes an electronic design file that is arranged to control the performance of the method of claim 1.

* * * * *

UNITED STATES PATENT AND TRADEMARK OFFICE
CERTIFICATE OF CORRECTION

| | | |
|---|---|---|
| PATENT NO. | : 8,114,756 B1 | Page 1 of 1 |
| APPLICATION NO. | : 12/850252 | |
| DATED | : February 14, 2012 | |
| INVENTOR(S) | : Fei Wang et al. | |

It is certified that error appears in the above-identified patent and that said Letters Patent is hereby corrected as shown below:

In column 6, line 42, delete "fowled" and insert -- formed --, therefor.

Signed and Sealed this
Twenty-sixth Day of June, 2012

David J. Kappos
*Director of the United States Patent and Trademark Office*